United States Patent [19]

Kuroyanagi et al.

[11] Patent Number: 5,993,770
[45] Date of Patent: Nov. 30, 1999

[54] SILICON CARBIDE FABRICATION

[75] Inventors: Akihiro Kuroyanagi; Tomiya Yasunaka, both of Chigasaki; Yuji Ushijima; Kenichi Kanai, both of Gotemba, all of Japan

[73] Assignee: Tokai Carbon Company, Ltd., Tokyo, Japan

[21] Appl. No.: 09/140,828

[22] Filed: Aug. 26, 1998

[30] Foreign Application Priority Data

Sep. 1, 1997 [JP] Japan ................................ 9-251394

[51] Int. Cl.⁶ ............................. C01B 31/36; B01J 27/22; B01J 27/224; C30B 13/00
[52] U.S. Cl. ......................... 423/345; 423/346; 502/177; 502/178; 117/95
[58] Field of Search .................... 423/345, 346; 502/177, 178

[56] References Cited

U.S. PATENT DOCUMENTS

| | | | |
|---|---|---|---|
| 4,990,374 | 2/1991 | Keeley et al. | 427/255.1 |
| 5,093,039 | 3/1992 | Kijima et al. | 252/516 |
| 5,200,157 | 4/1993 | Toya et al. | 422/246 |
| 5,248,385 | 9/1993 | Powell | 156/645 |
| 5,298,467 | 3/1994 | Hurtado et al. | 501/90 |
| 5,374,412 | 12/1994 | Pickering et al. | 423/346 |
| 5,407,750 | 4/1995 | Kinoshita et al. | 428/450 |
| 5,465,184 | 11/1995 | Pickering et al. | 360/97.01 |
| 5,612,132 | 3/1997 | Goela et al. | 428/332 |
| 5,668,188 | 9/1997 | Whinnery et al. | 423/345 |

*Primary Examiner*—Gary P. Straub
*Assistant Examiner*—Cam N. Nguyen
*Attorney, Agent, or Firm*—Flynn, Thiel, Boutell & Tanis, P.C.

[57] ABSTRACT

An SiC film having an excellent strength and thermal characteristics. The SiC film is prepared by a CVD process (i.e. CVD-SiC fabrication) and has a thermal conductivity along the direction of the SiC crystal growth between 100 and 300 W/m·K, and an average grain diameter of the internal structure between 4 to 12 $\mu$m. It is preferred that the ratio of the thermal conductivity along the direction of the SiC crystal growth to the thermal conductivity in the perpendicular direction is in a range of 1.10 to 1.40.

2 Claims, No Drawings

SILICON CARBIDE FABRICATION

FIELD OF THE INVENTION

The present invention relates to a silicon carbide fabrication that is excellent in compactness, corrosion resistance, strength characteristics, and therefore useful as a material used in semiconductor manufacturing, including for example susceptors, dummy wafers, target materials, or various jigs used in processes such as epitaxial growth, plasma etching, CVD process and the like.

BACKGROUND OF THE INVENTION

Silicon carbide (hereinafter referred to as "SiC") has excellent material characteristics such as thermal resistance, wear resistance, and corrosion resistance, which makes it useful a material for various industrial applications. In particular, an SiC fabrication (CVD-SiC fabrication) manufactured by utilizing a chemical vapor deposition (CVD) method is widely used in a variety of materials suitable for manufacturing semiconductors because of its compactness and high purity.

Such a CVD-SiC fabrication is prepared by having SiC crystal grains deposited on a substrate surface by a gas phase reaction of gaseous raw materials, and, after forming a solid coating by growing the crystal grains, removing the substrate body. The material, therefore, is characterized by its high compactness, high purity, and high degree of uniformity in structure.

As a CVD-SiC fabrication, for example, a CVD self-supported film structure is disclosed in Japanese Patent Application Laid-Open No. 188927/1995, wherein the CVD self-supported film structure comprising a heat resistant ceramic material such as SiC, $Si_3N_4$, and the like is characterized by having randomly orientated crystal grains. In this invention, the crystal grain orientation is randomized by an additional heat treatment at a temperature higher than the recrystallization temperature, for example between 1,700 to 2,200° C., so that anisotropy in the mechanical strength of the CVD self-supported film structure is reduced. Such an additional step, however, makes the manufacturing process more complicated.

Additionally, in Japanese Patent Application Laid-Open No. 188408/1996, there are disclosed methods for manufacturing a CVD-SiC fabrication by building an SiC coating on either side of an SiC substrate prepared by a CVD process, and also by forming an SiC coating on a substrate, turning it to an SiC substrate by removing said substrate, and building an additional SiC coating on both sides of the SiC substrate.

Furthermore, in Japanese Patent Application Laid-Open No. 188468/1996, there is disclosed a method for manufacturing a CVD-SiC fabrication comprising a lamination of three or more of SiC layers each having a thickness of 100 $\mu$m or less, and also a method for manufacturing a CVD-SiC fabrication employing a technique whereby an SiC coating is formed on a substrate and then made into an SiC fabrication by removing said substrate. In the latter method, a process of building an SiC layer with a CVD method and subsequently leveling the surface of said SiC layer is repeated several times to build a lamination of SiC layers, each having a thickness of 100 $\mu$m or less, to a desired total thickness prior to removing the substrate.

The above-mentioned inventions in the Japanese Patent Application Laid-Open Nos. 188408/1996 and 188468/1996 employ, for the purpose of preventing cracks or warp occurring on an SiC fabrication, methods wherein (a) the growth of an SiC coating is interrupted without bringing it to the desired thickness in one process, thereby minimizing accumulation of internal stress in the coating, to prepare an SiC coating made up with uniform crystal grains and reduced surface roughness, and thereafter an SiC coating is built on both top and back sides of said SiC coating used as a substrate (Japanese Patent Application Laid-Open No. 188408/1996); or (b) a process of interrupting the formation of an SiC layer at an earlier stage of growth and leveling the layer surface is repeated several times (Japanese Patent Application Laid-Open No. 188468/1966).

The above-mentioned inventions in the Japanese Patent Application Laid-Open Nos. 188408/1996 and 188468/1996, therefore, have such shortcomings as complicating the manufacturing process by requiring the CVD growth of an SiC coating to be interrupted without bringing it to the desired thickness in one process, or otherwise requiring leveling treatment of the surface, both adversely affecting the manufacturing efficiency. Moreover, the strength characteristics or thermal shock resistance of the product of these inventions still leaves much to be desired.

SUMMARY OF THE INVENTION

The present inventors have found that, as a result of research undertaken to solve the above-mentioned problems, by selecting and controlling the properties of SiC crystal grains deposited with a CVD process, a CVD-SiC fabrication having excellent strength and thermal characteristics is made available. The present invention is developed based on the above findings. Accordingly, an object of the present invention is to provide a CVD-SiC fabrication having an excellent strength and thermal characteristics without requiring complicated processing.

The SiC fabrication of the present invention to accomplish the above-mentioned object is an SiC fabrication prepared with a CVD process (CVD-SiC fabrication) which is structurally characterized in that the thermal conductivity along the direction of the SiC crystal growth is between 100 and 300 W/m·K, and the average grain diameter of the internal structure is 4 to 12 $\mu$m. Further, the ratio of the thermal conductivity along the direction of the SiC crystal growth to the thermal conductivity in the perpendicular direction is preferably set at a range of 1.10 to 1.40.

DETAILED DESCRIPTION OF THE INVENTION AND PREFERRED EMBODIMENTS

An SiC fabrication prepared with a CVD process, i.e. CVD-SiC fabrication, is obtained by a gas phase reaction of gaseous raw materials to deposit SiC on a substrate surface and by removing the substrate body thereafter. For such a substrate, a graphite or ceramic material is used. While processes such as cutting or grinding may be used in removing the substrate, in order to avoid deformation or ingress of impurities, it is preferred to use graphite material, which can be easily removed by burning off.

In the course wherein SiC is deposited with a CVD process and grown to form an SiC coating on the surface of a substrate, SiC kernels are first generated on the substrate surface by a gas phase reaction of raw material gases. The SiC kernels grow into amorphous SiC and then to minute polycrystalline SiC grains. Continuing the CVD reaction causes the minute polycrystalline SiC grains to grow further into a columnar crystalline structure to form an SiC coating. The SiC coating grows on the substrate surface and increases in thickness upward therefrom. The particle size of the crystals fluctuates while the SiC coating is growing. The strength and thermal characteristics of a CVD-SiC fabrication, therefore, vary widely depending on the grain properties of the SiC coating deposited and formed on the substrate.

The SiC fabrication of the present invention is defined as having a certain physical property of the SiC coating deposited and formed on the substrate, wherein the thermal conductivity along the direction of the SiC crystal growth is within a specific range of 100 to 300 W/m·K. When an SiC coating consists of SiC grains which are rich in minute polycrystalline SiC grains and with a low proportion of columnar grains, it intensifies the phonon dispersion at the grain boundary to increase the thermal resistance, thereby reducing the thermal conductivity and increasing the strength of the SiC coating formed. The reason why the thermal conductivity along the direction of the SiC crystal growth is limited in a specific range of 100 to 300 W/m·K is as follows: if the thermal conductivity is less than 100 W/m·K, it adversely affects the anti-thermal shock properties required in heating and cooling cycles. On the other hand, if the thermal conductivity is over 300 W/m·K, it increments the directional nature of the grain properties to increase the anisotropy of strength as well as thermal characteristics, making the fabrication prone to causing thermal deformation. The preferred range of the thermal conductivity is between 150 and 250 W/m·K.

Further, the SiC fabrication of the present invention requires an internal structure with an average grain diameter of 4 to 12 μm. The internal structure of a CVD-SiC fabrication consists of SiC grains of the SiC coating deposited and formed on a substrate surface by a CVD reaction, where the size of such SiC grains is affecting the strength and thermal characteristics of the CVD-SiC fabrication. When the grain diameter is small the grain boundary acts to moderate stress, whereas a larger grain diameter tends to cause the cleavage of the crystal grains themselves as a result of concentrated stress. Accordingly, the present invention provides for striking a balance between the strength and thermal characteristics by specifying the average grain diameter of the internal structure that constitute the CVD-SiC fabrication to a range of 4 to 12 μm. If an average grain diameter is less than 4 μm, it adversely affects thermal characteristics such as thermal conductivity, whereas an average grain diameter more than 12 μm could result in reduced strength characteristics such as a flexural strength of less than 600 Mpa. The preferred range of the average grain diameter is 5 to 8 μm.

Additionally, when the ratio of the thermal conductivity along the direction of the SiC crystal growth to the thermal conductivity in the perpendicular direction is in a range of 1.10 to 1.40, the property of the SiC grains becomes less anisotropic, which contributes to improved thermal characteristics as exemplified in the prevention of defects such as cracks occurring during the thermal shocks caused by a heating and cooling cycle. A CVD-SiC fabrication mainly comprises the cubic crystal system β-SiC that takes various forms of crystal growth, where, for example an X-ray diffraction shows a diffraction intensity for (111), (200), (220), and (311) in varied proportions. In some cases, the thermal conductivity of a CVD-SiC fabrication exhibits anisotropy depending on the crystal form. For example, when the reaction conditions, such as gas concentration or pressure, have raised the degree of supersaturation of the raw material gas, the crystal grows in a direction perpendicular to the substrate, resulting in anisotropy in the thermal conductivity to cause a declining trend in strength or anti-thermal shock properties.

A CVD-SiC fabrication is prepared typically by setting and heating a graphite material as a substrate in the reaction chamber of a CVD equipment, introducing a gaseous mixture of a halogenated organic silicon compound and hydrogen into the reaction chamber, forming an SiC coating of a desired thickness with the deposition of SiC on the substrate as produced by reduction-thermal decomposition of the halogenated organic silicon compound, and removing the graphite substrate thereafter. As a halogenated organic silicon compound for the raw material gas, compounds such as trichloromethyl silane, trichlorophenyl silane, dichloromethyl silane, dichlorodimethyl silane, chlorotrimethyl silane, and the like may be used. For removing the graphite substrate, an appropriate method is employed such as slicing off the graphite material or burning it off by heating it in air, among which, the burn-off procedure is preferred for its simplicity. Additionally, it is desirable to provide the fabrication with a grinding treatment for smoothing purposes after the removal of the graphite substrate.

The SiC fabrication of the present invention can be prepared by setting and controlling conditions such as the ratio of halogenated organic silicon compound as the raw material gas to hydrogen as the reduction agent, flow rate of the gaseous mixture, temperature or duration of the CVD reaction, and the furnace pressure of the CVD equipment.

EXAMPLES

In the following sections, detailed embodiment examples of the present invention are described in conjunction with comparative examples.

Examples 1–10 and Comparative Examples 1–11

As the substrate, a high-purity isotropic graphite material (with an ash content of 20 ppm or less) having a diameter of 202 mm and a thickness of 6 mm was set in a quartz reaction tube of a CVD equipment and heated. Using trichloromethyl silane for a halogenated organic silicon compound as the raw material gas, a gaseous mixture with hydrogen was prepared and fed into the reaction tube at a rate of 190 L/min wherein a CVD reaction was performed for 24 hours to form an SiC coating on the surface of the substrate. In doing so, SiC coatings of varying physical properties were deposited by changing the trichloromethyl silane concentration in the gaseous mixture, the CVD reaction temperature, and the pressure of the reaction tube. The substrate was then sliced in half at the radial cross-sectional direction, heated to 650° C. in air to burn off the graphite substrate, and subsequently provided with a grinding treatment to obtain a disc-shaped CVD-SiC fabrication having a diameter of 200 mm and a thickness of 1.2 mm.

For the SiC fabrications prepared above, the thermal conductivity, average grain diameter of the internal structure, and flexural strength were measured, and a thermal shock test was performed in accordance with the test methods provided below. The results obtained, together with the corresponding preparation conditions for each CVD-SiC fabrication tested, are shown in Table 1.

① Thermal conductivity (W/m·K):

The thermal conductivity was calculated from thermal diffusivity and specific heat capacity obtained by the Laser Flash method as provided in JIS R1611-1991, using the following equation:

$$\kappa = \alpha \times C_p \times \rho$$

where, κ=Thermal conductivity (W/m·K)
α=Thermal diffusivity (m$^2$/s)
$C_p$=Specific heat capacity (J/kg-K)
ρ=Bulk density (kg/m$^3$)

② Average grain diameter of the internal structure (μm):

A scanning electron microscope image of the test piece was observed at a magnification of 3,000, and the grain size at 50% cumulative area ratio is determined as the average grain diameter.

③ Flexural strength (MPa):

The flexural strength was tested in accordance with JIS R1601-1981, 3-point bending method.

④ Thermal shock test:

A sample piece kept at room temperature was placed in an electric furnace maintained at 1,200° C. under an inert atmosphere, taken out of the furnace 2 minutes later, allowed to cool down to 200° C. in air, and then put back into the furnace again. The heating cycle was repeated for a total of 10 times while the sample appearance was inspected after each cycle.

highly compact CVD-SiC fabrication, which has an excellent strength as well as thermal characteristics. Thus, the SiC fabrication in accordance with the present invention is extremely useful as a material used in semiconductor manufacturing, including for example, susceptors, dummy wafers, target materials, or various jigs used in processes such as epitaxial growth, plasma etching, CVD process and the like.

What is claimed is:

1. A SiC film manufactured by a chemical vapor deposition method, said film having a thermal conductivity along the direction of the SiC crystal growth between 150 and 250 W/m·K, an internal structure having an average grain diameter between 5 to 8 $\mu$m, and a ratio of the thermal conductivity along the direction of the SiC crystal growth to the thermal conductivity along the direction perpendicular to the direction of SiC crystal growth between 1.10 to 1.40.

2. A SiC film manufactured by a chemical vapor deposition method, said film having a thermal conductivity along the direction of SiC crystal growth between 150 to 250 W/m·K, an internal structure having an average grain diameter between 4 to 12 $\mu$m and a ratio of thermal conductivity along the direction of SiC crystal growth to the thermal conductivity along the direction perpendicular to the direction of SiC crystal growth between 1.10 and 1.40.

TABLE 1

CVD-SiC fabrication

| | Preparation conditions | | | Characteristics | | | | | |
|---|---|---|---|---|---|---|---|---|---|
| | Raw material concentration*[1] | Reaction temperature | Pressure | Thermal conductivity (W/m·K) | | | Average grain diameter | Flexural strength | Thermal |
| | (Vol %) | (° C.) | (Torr) | A*[2] | B*[3] | B/A | ($\mu$m) | (Mpa) | shock test |
| Example | | | | | | | | | |
| 1 | 7.5 | 1320 | 760 | 130 | 150 | 1.15 | 4 | 700 | Excellent |
| 2 | 7.5 | 1320 | 500 | 145 | 165 | 1.14 | 5 | 680 | Excellent |
| 3 | 7.5 | 1350 | 760 | 140 | 170 | 1.21 | 5 | 680 | Excellent |
| 4 | 7.5 | 1360 | 500 | 160 | 180 | 1.13 | 7 | 660 | Excellent |
| 5 | 7.5 | 1360 | 760 | 155 | 175 | 1.13 | 6 | 670 | Excellent |
| 6 | 5.0 | 1360 | 760 | 165 | 190 | 1.15 | 7 | 660 | Excellent |
| 7 | 7.5 | 1380 | 760 | 185 | 220 | 1.19 | 8 | 650 | Excellent |
| 8 | 7.5 | 1380 | 500 | 190 | 225 | 1.18 | 10 | 630 | Excellent |
| 9 | 5.0 | 1380 | 760 | 190 | 230 | 1.21 | 9 | 630 | Excellent |
| 10 | 7.5 | 1400 | 760 | 250 | 280 | 1.12 | 12 | 600 | Excellent |
| Comparative Example | | | | | | | | | |
| 1 | 7.5 | 1160 | 760 | 90 | 120 | 1.33 | 2 | 710 | 8 times*[4] |
| 2 | 7.5 | 1200 | 760 | 75 | 105 | 1.40 | 2 | 715 | 6 times*[4] |
| 3 | 7.5 | 1270 | 500 | 85 | 110 | 1.29 | 3 | 705 | 7 times*[4] |
| 4 | 7.5 | 1270 | 760 | 75 | 95 | 1.27 | 2 | 715 | 5 times*[4] |
| 5 | 5.0 | 1270 | 760 | 85 | 105 | 1.23 | 3 | 710 | 7 times*[4] |
| 6 | 10.0 | 1350 | 760 | 110 | 170 | 1.55 | 4 | 480 | 5 times*[4] |
| 7 | 12.5 | 1380 | 760 | 150 | 240 | 1.60 | 6 | 470 | 5 times*[4] |
| 8 | 7.5 | 1400 | 500 | 270 | 300 | 1.11 | 14 | 540 | Excellent |
| 9 | 5.0 | 1400 | 760 | 320 | 350 | 1.09 | 15 | 520 | Excellent |
| 10 | 7.5 | 1450 | 500 | 370 | 390 | 1.05 | 18 | 440 | Excellent |
| 11 | 7.5 | 1450 | 760 | 360 | 380 | 1.06 | 17 | 450 | Excellent |

Notes
*[1] Trichloromethyl silane concentration in the gas mixture, in Vol %
*[2] Thermal conductivity perpendicular to the direction of SiC crystal growth, in W/m·K
*[3] Thermal conductivity along the direction of SiC crystal growth, in W/m·K
*[4] Number of heating cycles to produce cracks It is evident from the test results given in Table 1 that the SiC fabrications in the embodiment examples having a thermal conductivity along the direction of the SiC crystal growth (denoted in the Table as "B") in the range of 100 to 300 W/m·K and an average grain diameter of the internal structure between 4 and 12 $\mu$m all exhibit a higher flexural strength and better anti-thermal shock property than the comparative examples. Furthermore, when the ratio (B/A) of the thermal conductivity (B) along the direction of the SiC crystal growth to the thermal conductivity (A) in the perpendicular direction is in a range of 1.10 to 1.40, the improvement in the anti-thermal shock property becomes more prominent.

As described in the foregoing, the present invention provides an SiC fabrication, comprising a high purity and

* * * * *